INVENTOR.
KENNETH R. HACKETT
BY R. P. Campbell
ATTORNEY

HIGH SPEED DELTA ENCODER

Filed Sept. 18, 1963

INVENTOR.
KENNETH R. HACKETT
BY R. P. Campbell
ATTORNEY 3,270,335

HIGH SPEED DELTA ENCODER

Kenneth R. Hackett, Boulder, Colo., assignor to Ball Brothers Research Corporation, Boulder, Colo., a corporation of Colorado Filed Sept. 18, 1963, Ser. No. 309,758
6 Claims. (Cl. 340—347)

This invention relates to the conversion of wide band, complex voltage waveforms, such as those found in television, to a binary pulse code, and particularly a delta code.

Very high pulse repetition rates are involved in the transmission of television signals by the use of a pulse code system. In encoder circuits employing a feedback loop, objectionable delay is encountered around the loop. This often is caused by the use of complex high speed digital logic circuitry in the feedback loop. The importance of loop delay time is the limiting factor for the video input signal sampling rate. Another problem encountered in high speed delta encoders is objectionable analog leakage. Using conventional techniques, it is difficult to build a high speed encoder and keep these problems to a practical minimum.

Accordingly, it is an important object of this invention to provide a very high speed encoder overcoming the foregoing problems and which will convert high speed signals, such as high resolution television, to a binary code with minimum feedback loop delay time.

Another object of this invention is to provide a closed loop encoder circuit characterized by the use of efficient, high speed digital logic circuitry in the feedback loop.

A further object of this invention is to provide an integrating circuit for a very high speed encoder which employs the principle of algebraic current addition instead of complex digital logic circuitry.

Additional objects will become apparent from the following description, which is given primarily for purposes of illustration, and not limitation.

Stated in general terms, the objects of the invention are attained by minimizing the problems encountered in prior art high speed delta encoders, using conventional techniques, by providing a very high speed delta encoder employing a novel technique, involving the use of a silicon transistor operating in the avalanche mode, because of its inherent speed and insensitivity to analog. The silicon transistor is used as the decisive element in the feedback loop of the encoder and is activated by a clock pulse and the error voltage from an adder. The resultant output is a very fast pulse at a clock period when the error voltage is above a certain threshold value and no output pulse when the error voltage is below the threshold value. In this arrangement, the magnitude of the output pulse is very insensitive to the magnitude of the error voltage and thus results in the production of either a unit amplitude pulse or no pulse. Also, due to the inherent speed of the avalanche mode of the silicon transistor there is negligible delay.

Figure 1:
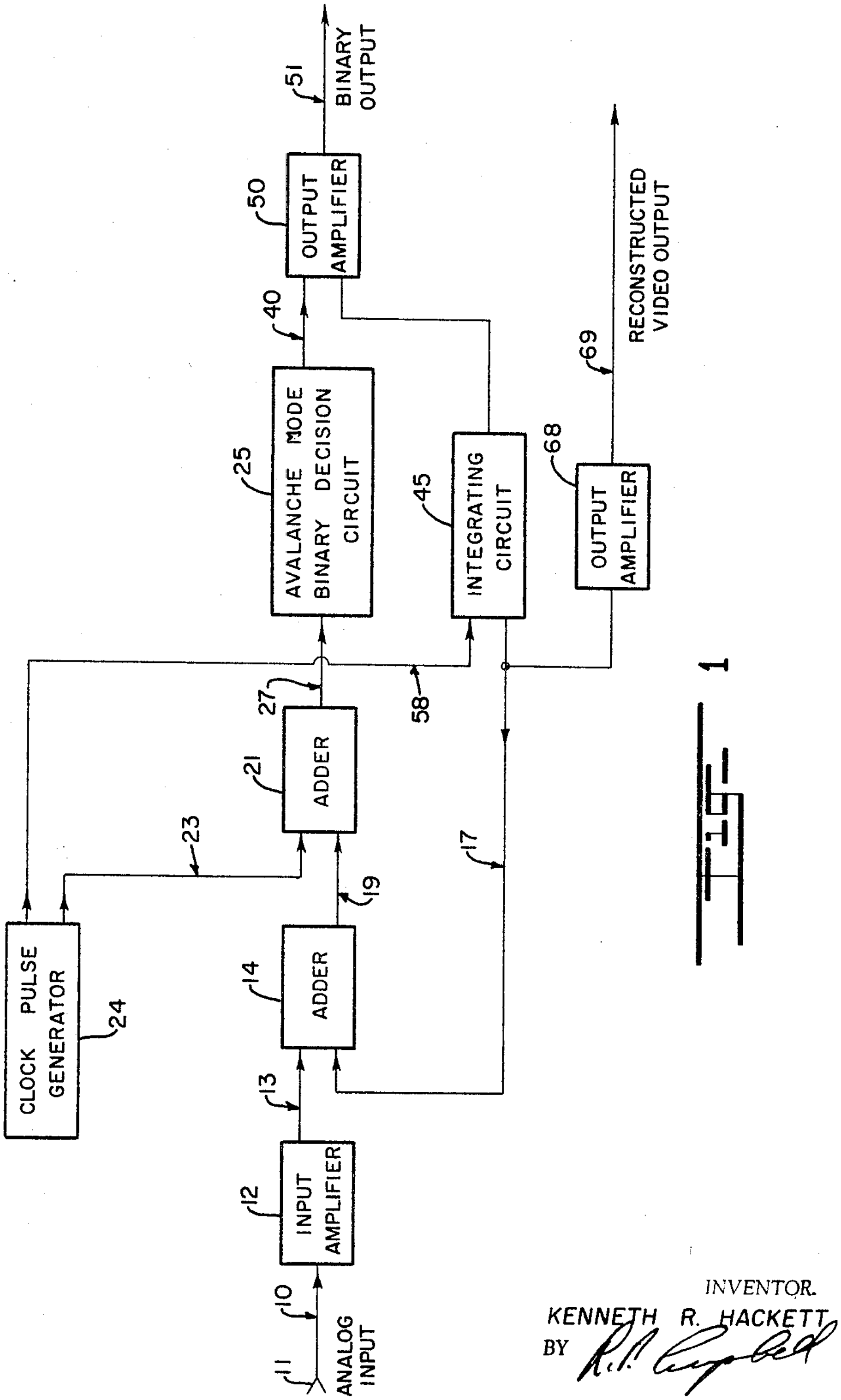
Figure 2:
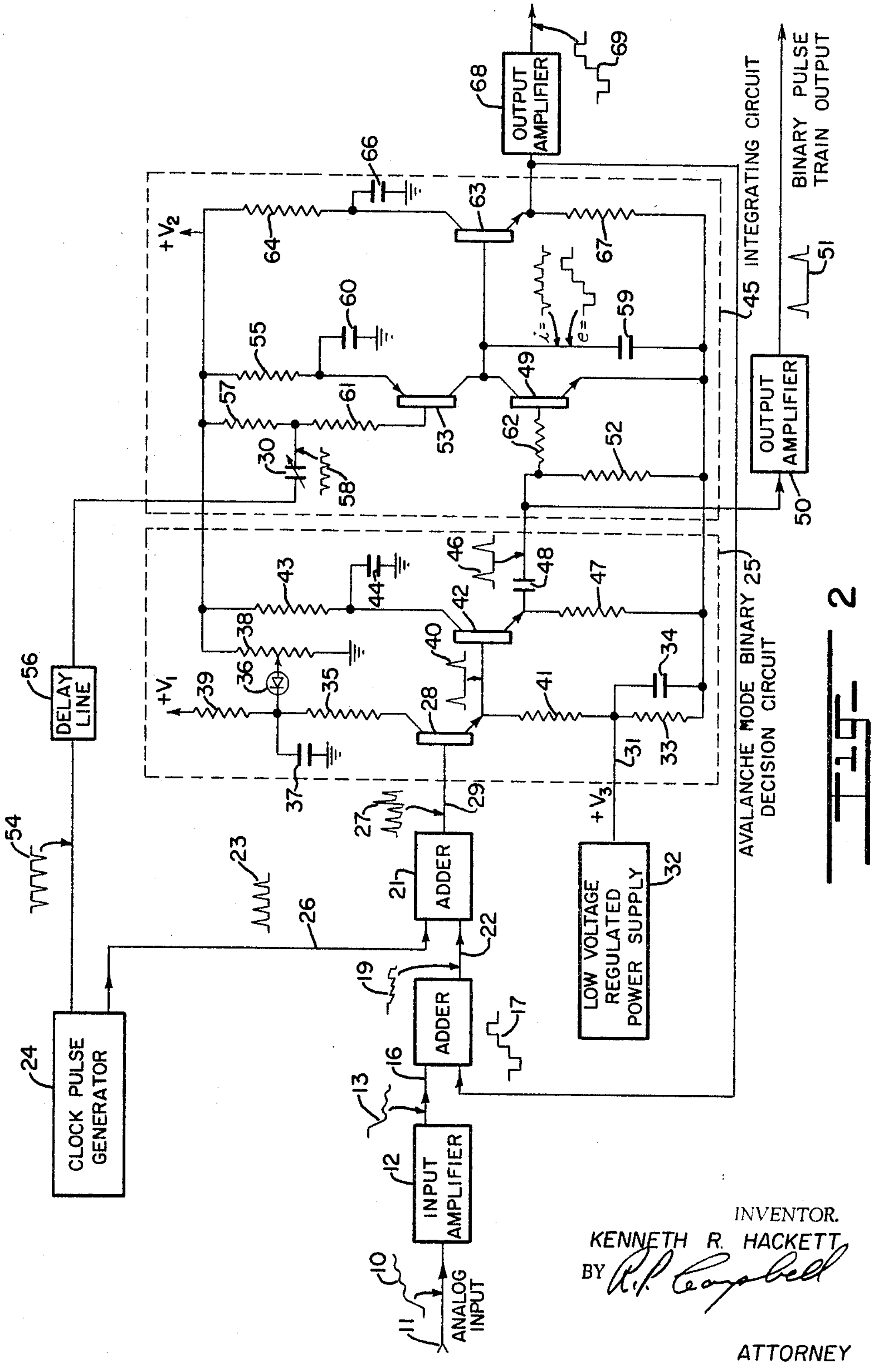

A more detailed description of a specific embodiment of the invention is given below with reference to the accompanying drawings wherein the conventional circuitry elements are shown in solid block throughout and wherein;

FIG. 1 is a generalized block diagram schematically showing a very high speed delta encoder according to the invention; and FIG. 2 is a more specific schematic diagram along the lines of the diagram of FIG. 1, but showing some circuit details.

In operation, the video signal 10 enters the input terminal 11 and is introduced into amplifier 12, where it is amplified and inverted. The output signal 13 of amplifier 12 is fed into adder 14 through one of its inputs 16. In adder 14 signal 13 is added to the quantized video signal 17, which is fed into the adder through the other of its inputs 18. Quantized video signal 17 is taken from the output of the encoder.

The output signal 19 of adder 14 is fed into adder 21 through one of its inputs 22. The positive clock pulse train 23, produced by clock pulse generator 24 is fed into adder 21 through its other input 26. The output signal 27 of adder 21 is fed directly into the base of the avalanche transistor 28 through base connection 29, transistor 28 being located in the avalanche mode binary decision circuit 25.

The base of avalanche transistor 28 is back-biased by the positive bias $+V_3$ in the emitter circuit 31. Bias voltage $+V_3$ is generated by the adjustable low voltage regulated power supply 32 with resistor 33 placing a load on power supply 32 so that it will regulate properly. Capacitor 34 is used as a high-frequency bypass of resistor 33.

The collector supply voltage on avalanche transistor 28 is regulated by the zener diode 36. Capacitor 37 is used to shunt the high frequency components to ground, as indicated and the potentiometer 38 is used to adjust the collector voltage. The current through zener diode 36 is determined by the voltage $+V_1$ and the resistor 39, zener diode 36 also acting as a current limiter to protect transistor 28. Should an overload current exist due to a loss in bias voltage $+V_3$, zener diode 36 ceases to regulate, and thus allows the collector voltage of transistor 28 to drop.

Transistor 28 is triggered into the avalanche mode when the pulse output 27 from adder 21 is greater than a certain positive voltage. The amplitude of the avalanche pulse 40, which appears across resistor 41, is very insensitive to the input trigger amplitude 27. This phenomenon is a characteristic of the avalanche mode of operation for a transistor, which makes transistor 28 ideally suited for use as a threshold decision element. Transistor 28 operates effectively as a decision element at extremely high speeds. Resistor 35 is in series with the collector of transistor 28 and this permits the collector voltage to drop after it is triggered into the avalanche region, thus resetting it to quiescent state.

The emitter of avalanche transistor 28 is coupled directly into the base of transistor 42, which is connected in the emitter follower configuration to isolate avalanche transistor 28 from the rest of the system. Resistor 43 and capacitor 44 are used to decouple to ground, as shown, the high frequency components from the power supply 32. The pulse output 46 of transistor 42 appears across resistor 47 and the latter, namely resistor 47, in turn, is coupled by capacitor 48 to the base of transistor 49 and to the output amplifier 50, which produces the binary pulse train output 51.

An avalanche pulse without a D.C. component is developed across resistor 52 located in integrating circuit 45. Transistor 49 and the transistor 53 comprise the active portion of the integrator in the feedback loop of the delta encoder. The negative output 54 from clock pulse generator 24 is delayed by the adjustable delay line 56 to compensate for the delay of the positive pulse train 23 through its path. Resistor 57 is used to raise the pulse train to the same D.C. voltage level that exists on the emitter of transistor 53. The variable capacitor 30 is used to vary the amplitude of the pulse train 58 appearing across resistor 57.

Pulses appearing across resistor 52 inject current pulses into the base of transistor 49 with sufficient amplitude to reduce the voltage across the integrating capacitor 59 by two units. The pulse train 58, that appears across resistor 57, similarly results in increasing the voltage on the integrating capacitor 59 by one unit. When there is a pulse appearing across resistor 52, the net change in voltage across capacitor 59 is one step down (negative). When one pulse appears across resistor 52, the net voltage change on capacitor 59 is one step up (positive). Thus, by the use of algebraic current addition in this manner, complex high speed digital logic circuitry is avoided. The resultant current flowing in capacitor 59 due to the clock pulses 58 and the binary pulses 40 and 46 as indicated by *i* and *e* denotes the reconstructed video signal (same as signal 17).

Resistor 61 limits the current introduced into the base of transistor 53 and resistor 62 limits that introduced into the base of transistor 49. The respective values of resistors 61 and 62 are chosen to compensate for differences in the respective characteristics of transistors 53 and 49. Resistor 55 and capacitor 60 form a filter which prevents any pulse energy from getting back into the power supply.

The voltage appearing across integrating capacitor 59 is isolated by transistor 63. Transistor 63 is used in the emitter follower configuration to provide minimum loading of the integrator feedback loop circuit. Resistor 64 and capacitor 66 are used to decouple to ground, as indicated, the high frequency components from power supply 32.

The voltage that appears across resistor 67 is the quantized video signal 17 which is taken from the output of the encoder and fed back to adder 14 through its input 18. This voltage also is coupled to output amplifier 68 which produces the quantized output signal 69, or reconstructed video output. From the foregoing it should be clear that the objectives of the present invention are achieved and the mentioned problems of prior encoders are overcome.

Obviously many other modifications and variations of the high speed delta encoder of the present invention are possible in the light of the teaching given hereinabove. It is, therefore, to be understood that, within the scope of the appended claims, the invention can be practiced otherwise than as specifically described.

What is claimed is:

1. A high speed delta encoder comprising an input amplifier circuit, an adder circuit connected to receive the output from said input amplifier circuit, an avalanche mode binary decision circuit including a silicon transistor operating in the avalanche mode connected to receive the output from said adder circuit, an integrating circuit connected to receive the output from said binary decision circuit and connected to supply an output to said adder circuit to establish a feedback loop, clock pulse generator means connected to said binary decision circuit and to said integrating circuit, and an output amplifier circuit connected to receive the output from said binary decision circuit for transmitting therefrom a digital output converted from an analog input fed to said input amplifier circuit.

2. A high speed delta encoder comprising an input amplifier circuit, an adder circuit connected to receive the output from said amplifier circuit, an avalanche mode binary decision circuit including a silicon transistor operating in the avalanche mode connected to receive the output from said adder circuit, an integrating circuit connected to receive the output from said binary decision circuit and connected to supply an output to said adder circuit to establish a feedback loop, clock pulse generator means connected to said binary decision circuit and to said integrating circuit, said silicon transistor serving as the decisive element in the feedback loop of the encoder and being activated by a clock pulse from said clock pulse generator means and the error voltage from said adder circuit to produce with negligible delay a very fast pulse at a clock period when the error voltage is above a certain threshold value and no pulse when the error voltage is below the threshold value, and an output amplifier circuit connected to receive the output from said binary decision circuit for transmitting therefrom a digital output converted from an analog input fed to said input amplifier circuit.

3. A high speed delta encoder according to claim 2, wherein a second output amplifier circuit is connected in the feedback loop between said integrating circuit and said adder circuit for producing a reconstructed video output.

4. A high speed delta encoder according to claim 2, wherein the output signal of said adder circuit is fed directly into the base of said avalanche mode silicon transistor, the collector supply voltage on said avalanche mode silicon transistor is regulated by a zener diode, and the emitter of said avalanche mode silicon transistor is connected directly into the base of a second transistor in an emitter follower configuration to isolate said avalanche mode silicon transistor from the remainder of the system.

5. A high speed delta encoder comprising input means, an adder circuit connected to receive the output from said input means, an avalanche mode binary decision circuit including a silicon transistor operating in the avalanche mode connected to receive the output from said adder circuit, an integrating circuit connected to receive the output from said binary decision circuit and connected to supply an output to said adder circuit to establish a feedback loop, clock pulse generator means connected to said binary decision circuit and to said integrating circuit, and output means connected to receive the output from said binary decision circuit for transmitting therefrom a digital output converted from an analog input fed to said input means.

6. A high speed delta encoder comprising input means, an adder circuit connected to receive the output from said input means, an avalanche mode binary decision circuit operating in the avalanche mode connected to receive the output from said adder circuit, an integrating circuit connected to receive the output from said binary decision circuit and connected to supply an output to said adder circuit to establish a feedback loop, clock pulse generator means connected to said binary decision circuit and to said integrating circuit, and output means connected to receive the output from said binary decision circuit for transmitting therefrom a digital output converted from an analog input fed to said input means.

No references cited.

MAYNARD R. WILBUR, *Primary Examiner.*

DARYL W. COOK, *Examiner.*

K. R. STEVENS, *Assistant Examiner.*